(12) United States Patent
Hotta et al.

(10) Patent No.: US 8,647,527 B2
(45) Date of Patent: Feb. 11, 2014

(54) POLISHING COMPOSITION AND POLISHING METHOD USING THE SAME

(75) Inventors: Kazutoshi Hotta, Ichinomiya (JP); Kanji Kawata, Inuyama (JP)

(73) Assignee: Fujimi Incorporated, Kiyosu-shi (JP)

( * ) Notice: Subject to any disclaimer, the term of this patent is extended or adjusted under 35 U.S.C. 154(b) by 1481 days.

(21) Appl. No.: 12/018,672

(22) Filed: Jan. 23, 2008

(65) Prior Publication Data

US 2008/0173843 A1    Jul. 24, 2008

(30) Foreign Application Priority Data

Jan. 23, 2007  (JP) ................................. 2007-012164

(51) Int. Cl.
 *C09K 13/08* (2006.01)
 *C09K 13/04* (2006.01)
 *C09K 13/06* (2006.01)

(52) U.S. Cl.
 USPC ....... 252/79.3; 252/79.2; 252/79.1; 252/79.4; 252/79.5

(58) Field of Classification Search
 USPC .............................................. 252/79.1, 79.5
 See application file for complete search history.

(56) References Cited

U.S. PATENT DOCUMENTS

| | | | |
|---|---|---|---|
| 3,986,970 A * | 10/1976 | Shiga | ............................ 252/79.3 |
| 5,980,775 A | 11/1999 | Grumbine et al. | |
| 6,015,506 A | 1/2000 | Streinz et al. | |
| 6,068,787 A | 5/2000 | Grumbine et al. | |
| 6,835,120 B1 | 12/2004 | Matsui | |
| 2004/0175948 A1 * | 9/2004 | DeSimone et al. | ........... 438/690 |
| 2005/0059247 A1 | 3/2005 | Ikenaka | |
| 2005/0211953 A1 * | 9/2005 | Jha et al. | ...................... 252/79.1 |
| 2007/0021040 A1 | 1/2007 | Kawata et al. | |
| 2008/0261401 A1 | 10/2008 | Kerr et al. | |

FOREIGN PATENT DOCUMENTS

| | | |
|---|---|---|
| JP | 2001-205555 | 7/2001 |
| JP | 2003-282496 | 10/2003 |
| JP | 2005-117027 | 4/2005 |
| JP | 2005-123451 | 5/2005 |
| JP | 2005-223257 | 8/2005 |
| JP | 2005-259731 | 9/2005 |
| WO | 2006076392 A2 | 7/2006 |
| WO | 2006076392 A3 | 7/2006 |

* cited by examiner

*Primary Examiner* — Nadine G Norton
*Assistant Examiner* — Mahmoud Dahimene

(57) ABSTRACT

A polishing composition contains a vanadate such as ammonium vanadate, sodium vanadate, and potassium vanadate and an oxygen donor such as hydrogen peroxide and ozone. It is preferable that the polishing composition further contains at least either one of abrasive grains and a pH adjusting agent. The polishing composition can be suitably used for polishing a silicon carbide wafer such as a hexagonal silicon carbide single crystal wafer.

6 Claims, No Drawings

POLISHING COMPOSITION AND POLISHING METHOD USING THE SAME

BACKGROUND OF THE INVENTION

The present invention relates to a polishing composition used mainly for polishing a silicon carbide wafer, more specifically, for polishing the (0001)Si face of a hexagonal silicon carbide single crystal wafer or the surface of a hexagonal silicon carbide single crystal wafer other than the (0001)Si face such as the (000-1)C face, and to a method for polishing a silicon carbide wafer using the polishing composition.

A hexagonal silicon carbide single crystal wafer such as a 4H—SiC single crystal wafer and a 6H—SiC single crystal wafer is, typically, manufactured through the preliminary polishing step of a wafer surface using slurry containing diamond abrasive grains and the finish polishing step of the wafer surface after preliminary polish. In the finish polishing of a hexagonal silicon carbide single crystal water, a work affected layer of amorphous generated on the wafer surface by preliminary polishing is removed and the wafer surface is flattened after the removal of the work affected layer.

As a polishing composition usable in finish polishing of a hexagonal silicon carbide single crystal wafer, a polishing composition containing colloidal silica with a pH of 4 to 9 has been known as disclosed in Japanese Laid-Open Patent Publication No. 2005-117027. However, the removal rate of polishing a hexagonal silicon carbide single crystal wafer with the polishing composition according to the document is not sufficiently high. Therefore, the time required for finish polishing is extremely long when the polishing composition according to the document is used.

In addition, Japanese Laid-open Patent Publication No. 2001-205555 discloses polishing of a silicon carbide single crystal wafer using a polishing composition containing chromium oxide abrasive grains and hydrogen peroxide. However, chromium oxide contained in the polishing composition according to the document has a possibility of contaminating a wafer by adhering to the wafer surface after polishing in addition to its significant harmful effect on the environment.

SUMMARY OF THE INVENTION

Accordingly, it is an objective of the present invention is to provide a polishing composition more suitably usable for polishing a silicon carbide wafer such as a hexagonal silicon carbide single crystal wafer, and to provide a method for polishing a silicon carbide wafer using the polishing composition.

To achieve the foregoing objective and in accordance with one aspect of the present invention, a polishing composition containing a vanadate and an oxygen donor is provided.

In accordance with another aspect of the present invention, a method including polishing a silicon carbide wafer using the polishing composition is provided.

Other aspects and advantages of the invention will become apparent from the following description, illustrating by way of example the principles of the invention.

DETAILED DESCRIPTION OF THE PREFERRED EMBODIMENTS

One embodiment of the present invention will be described hereunder.

A polishing composition according to the embodiment is produced by mixing a vanadate and an oxygen donor, preferably, together with at least one of abrasive grains and a pH adjusting agent with water. Thus, the polishing composition contains a vanadate, an oxygen donor, and water, preferably, further at least one of abrasive grains and a pH adjusting agent.

The polishing composition is used for polishing a silicon carbide wafer, more specifically, for polishing the (0001)Si face of a hexagonal silicon carbide single crystal wafer or the surface of a hexagonal silicon carbide single crystal wafer other than the (0001)Si face such as the (000-1)C face. In the (0001)Si face, the oxidation rate and etching rate are lower than in the surface of a hexagonal silicon carbide single crystal wafer other than the (0001)Si face such as the (000-1)C face. In general, the removal rate of polishing the (0001) Si face with a polishing composition is lower compared to the removal rate of polishing the surface of a hexagonal silicon carbide single crystal wafer other than the (0001)Si face with the same polishing composition. In addition, both surfaces of a hexagonal silicon carbide single crystal wafer are, typically, constituted of crystal faces with different plane directions, that is, the (0001)Si face and the (000-1)C face. Since about 12% of the Si—C bonds in a hexagonal silicon carbide single crystal are ionic bonds, the (0001)Si face is slightly positively charged and the (000-1)C face is slightly negatively charged.

The vanadate and the oxygen donor cooperate to increase the removal rate of polishing a silicon carbide wafer such as a hexagonal silicon carbide single crystal wafer. Presumably, this action of the vanadate and the oxygen donor is due to that vanadate ions generated through electrolytic dissociation of the vanadate produce metastable peroxovanadate ions by accepting oxygen from the oxygen donor, and the peroxovanadate ions promote the oxidative cleavage of Si—C bonds on the surface of a silicon carbide wafer. In this case, although a peroxovanadate ion is reduced to a vanadate ion by oxidatively cleaving a Si—C bond, it can return to a peroxovanadate ion by accepting oxygen from the oxygen donor.

A vanadate contained in the polishing composition is, for example, ammonium vanadate, sodium vanadate, or potassium vanadate.

The content of a vanadate in the polishing composition is preferably 0.5 g/L or more, more preferably 1 g/L or more, further preferably 3 g/L or more. As the content of a vanadate increases, the removal rate of polishing a silicon carbide wafer with the polishing composition increases. Regarding this point, if the content of a vanadate in the polishing composition is 0.5 g/L or more, more specifically 1 g/L or more, even more specifically 3 g/L or more, it is advantageous from the standpoint that the removal, rate of polishing a silicon carbide wafer with the polishing composition is increased to an especially suitable level for practical use.

In addition, the content of a vanadate in the polishing composition is preferably 100 g/L or less, more preferably 50 g/L or less, further preferably 30 g/L or less. As the content of a vanadate decreases, the material cost of the polishing composition is reduced, and in addition, the possibility of formation of insoluble matter in the polishing composition is reduced. Regarding this point, it is advantageous if the content of a vanadate in the polishing composition is 100 g/L or less, more specifically 50 g/L or less, even more specifically 30 g/L or less, from the standpoint not only of economic efficiency but also that the formation of insoluble matter is sufficiently reduced.

An oxygen donor contained in the polishing composition is, for example, hydrogen peroxide and ozone, and preferably hydrogen peroxide because of easy handling.

The content of an oxygen donor in the polishing composition is preferably 0.1 g/L or more, more preferably 1 g/L or more, further preferably 3 g/L or more. As the content of an oxygen donor increases, the removal, rate of polishing a silicon carbide wafer with the polishing composition increases. Regarding this point, it is advantageous if the content of an oxygen donor in the polishing composition is 0.1 g/L or more, more specifically 1 g/L or more, even more specifically 3 g/L or more, from the standpoint that the removal rate of polishing a silicon carbide wafer with the polishing composition is increased to an especially suitable level for practical use.

In addition, the content of an oxygen donor in the polishing composition is preferably 100 g/L or less, more preferably 50 g/L or less, further preferably 30 g/L or less. As the content of an oxygen donor decreases, the material cost of the polishing composition is reduced. Regarding this point, it is advantageous from the standpoint of economic efficiency if the content of an oxygen donor in the polishing composition is 100 g/L or less, more specifically 50 g/L or less, even more specifically 30 g/L or less.

The abrasive grains have an action of mechanically polishing a silicon carbide wafer, and act to increase the removal rate of polishing a silicon carbide wafer such as a hexagonal silicon carbide single crystal wafer with the polishing composition.

Abrasive grains contained in the polishing composition consist of, for example, a metal oxide such as silica, alumina, iron oxide, or chromium oxide, diamond, boron carbide, or silicon carbide. Among them, silica is preferable, and colloidal silica is more preferable from the standpoint of ability to lessen scratches on a wafer surface after polishing and its low environmental hazard.

In the case where the polishing composition contains colloidal silica, the content of colloidal silica in the polishing composition is preferably 1% by mass or more, more preferably 3% by mass or more, further preferably 5% by mass or more. As the content of colloidal silica increases, the removal rate of polishing a silicon carbide wafer with the polishing composition increases. Regarding this point, it is advantageous if the content of colloidal silica in the polishing composition is 1% by mass or more, more specifically 3% by mass or more, even more specifically 5% by mass or more, from the standpoint that the rate of polishing a silicon carbide wafer with the polishing composition is increased to an especially suitable level for practical use.

In addition, the content of colloidal silica in the polishing composition is preferably 50% by mass or less, more preferably 45% by mass or less, further preferably 40% by mass or less. As the content of colloidal silica decreases, the material cost of the polishing composition is reduced. Regarding this point, it is advantageous from the standpoint of economic efficiency if the content of colloidal silica in the polishing composition is 50% by mass or less, more specifically 45% by mass or less, even more specifically 40% by mass or less.

The average primary particle diameter of colloidal silica contained in the polishing composition is preferably 5 nm or more, more preferably 10 nm or more, further preferably 15 nm or more. As the average primary particle diameter increases, the removal rate of polishing a silicon carbide wafer with the polishing composition increases because the action of colloidal silica to mechanically polish a silicon carbide wafer is strengthened. Regarding this point, it is advantageous if the average primary particle diameter of colloidal, silica is 5 nm or more, more specifically 10 nm or more, even more specifically 15 nm or more from the standpoint that the removal rate of polishing a silicon carbide wafer with the polishing composition is increased to an especially suitable level for practical use.

In addition, the average primary particle diameter of colloidal silica contained in the polishing composition is preferably 120 nm or less, more preferably 100 nm or less, further preferably 85 nm or less. As the average primary particle diameter decreases, the manufacturing cost of colloidal silica is reduced. Regarding this point, it is advantageous from the standpoint of economic efficiency if the average primary particle diameter of colloidal silica is 120 nm or less, more specifically 100 nm or less, even more specifically 85 nm or less. The average primary particle diameter of colloidal silica mentioned above is calculated based on the specific surface area of colloidal silica measured by BET method.

The type of the pH adjusting agent is not specifically restricted, and an appropriate amount of any acid or alkali may be used to adjust the pH of the polishing composition to a desired value.

In the case where the polishing composition is intended to be used for polishing the (0001)Si face of a hexagonal silicon carbide single crystal wafer, the pH of the polishing composition is preferably 4 or more, more preferably 4.5 or more, further preferably 5 or more. As the pH increases, the removal rate of polishing the (0001)Si face with the polishing composition increases. Regarding this point, it is advantageous if the pH of the polishing composition is 4 or more, more specifically 4.5 or more, even more specifically 5 or more from the standpoint that the removal rate of polishing the (0001)Si face with the polishing composition is increased to an especially suitable level for practical use.

The reason why the removal rate of polishing the (0001)Si face with the polishing composition increases as the pH increases is presumed as the following. That is, it is thought that hydrogen ions in the polishing composition act to inhibit peroxovanadate ions, which are anions, from being electrically attracted toward the (0001)Si face which is slightly positively charged. Thus, presumably, as a hydrogen ion concentration in the polishing composition decreases, peroxovanadate ions are attracted to the (0001)Si face with less inhibition by hydrogen ions, so that peroxovanadate ions facilitate the oxidative cleavage of Si—C bonds on the (0001) Si face. In addition, it is also presumed to be the reason that as the pH of the polishing composition increases, the dissolution of oxidized silicon film is facilitated which film is formed on the (0001)Si face by the oxidation of silicon atoms on the most superficial surface of the (0001)Si face.

In addition, in the case where the polishing composition is intended to be used for polishing the (0001)Si face of a hexagonal silicon carbide single crystal wafer, the pH of the polishing composition is preferably 11.5 or less, more preferably 10.5 or less, further preferably 9.5 or less. As the pH decreases, the possibility of dissolution of abrasive grains in the polishing composition is lessened and the stability of the oxygen donor, especially hydrogen peroxide in the polishing composition is improved. Regarding this point, it is advantageous if the pH of the polishing composition is 11.5 or less, more specifically 10.5 or less, even more specifically 9.5 or less from the standpoint that the dissolution of abrasive grains in the polishing composition is sufficiently inhibited and the stability of the oxygen donor in the polishing composition is especially improved.

On the other hand, in the case where the polishing composition is intended to be used for polishing the surface of a hexagonal silicon carbide single crystal wafer other than the (0001)Si face such as the (000-1)C face, the pH of the polishing composition is preferably 8 or less, more preferably 7.5 or less, further preferably 7 or less. As the pH decreases, the removal rate of polishing the surface of a hexagonal silicon carbide single crystal wafer other than the (0001)Si face with the polishing composition increases. Regarding this point, it is advantageous if the pH of the polishing composition is 8 or less, more specifically 7.5 or less, even more specifically 7 or less from the standpoint that the removal rate of polishing the surface of a hexagonal silicon carbide single crystal wafer other than the (0001)Si face with the polishing composition is increased to an especially suitable level for practical use.

Regarding why the removal rate of polishing the surface of a hexagonal silicon carbide single crystal wafer other than the (0001)Si face, especially the (000-1)C face with the polishing composition increases as the pH decreases, the reason is presumed as follows. That is, it is thought that hydrogen ions in the polishing composition act to electrically attract peroxovanadate ions to the (000-1)C face by mediating between the slightly negatively charged (000-1)C face and peroxovanadate ions which are anions. It is thought that, for this reason, peroxovanadate ions are attracted to the (000-1)C face through the mediation of hydrogen ions as the hydrogen ion concentration in the polishing composition increases, so that peroxovanadate ions facilitate the oxidative cleavage of Si—C bonds on the (000-1)C face. In addition, it is presumed that when the (000-1)C face is removed by polishing, carbon atoms of the most superficial surface are detached first by gasification due to oxidation, then silicon atoms ionized by oxidation are detached, while it is also presumed to be the reason that such detachment of carbon atoms and silicon atoms are accelerated by the strengthening of oxidation force with the pH decrease of the polishing composition.

Accordingly, in the case where the polishing composition is intended to be used for polishing the (0001)Si face and the surface of a hexagonal silicon carbide single crystal wafer other than the (0001)Si face at the same time, especially the (0001)Si face and the (000-1)C face at the same time, the pH of the polishing composition is preferably 4 to 8, more preferably 4.5 to 7.5, further preferably 5 to 7. When the pH of the polishing composition is within the above-mentioned range, both of the (0001)Si face and the surface of a hexagonal silicon carbide single crystal wafer other than the (0001)Si face is polished at a high removal rate.

According to the present embodiment, the following advantages are obtained.

The polishing composition of this embodiment can be used to polish a silicon carbide wafer such as a hexagonal silicon carbide single crystal wafer at a high removal rate, since it contains a vanadate and the oxygen donor. The polishing composition of this embodiment, therefore, can be suitably used for polishing a silicon carbide wafer such as a hexagonal silicon carbide single crystal wafer.

The present embodiment may be modified as follows.

The polishing composition of the embodiment may contain two or more types of vanadates.

The polishing composition of the embodiment may contain two or more types of oxygen donors.

The polishing composition of the embodiment may contain two or more types of abrasive grains.

The polishing composition of the embodiment may contain two or more types of pH adjusting agents.

Heretofore known additives such as preservatives or fungicides may be added to the polishing composition of the embodiment according to need.

The polishing composition of the embodiment may be provided as a one-part product which is preserved in one container containing all components or as a multi-part product as represented by a two-part product which is dividedly preserved in two containers.

The polishing composition of the embodiment may be prepared by dilution of an undiluted solution of the polishing composition with water.

The polishing composition of the embodiment may be used for polishing an object other than a silicon carbide wafer.

Examples of the present invention and Comparative Examples will be described hereunder.

In Examples 1 to 16 and Comparative Examples 1 to 9, polishing compositions were each prepared by appropriately mixing a vanadate or its alternative, an oxygen donor, abrasive grains, and a pH adjusting agent with water. The details of vanadate or its alternative, an oxygen donor, abrasive grains, and a pH adjusting agent in each polishing composition, and the results of measuring the pH of the polishing compositions are shown in Table 1. Any of the average primary particle diameters of colloidal silica used as abrasive grains is 40 nm.

The column of "removal rate of the (0001)Si face" of Table 1 shows results of evaluating the removal rate of polishing the (0001)Si face of a hexagonal silicon carbide single crystal wafer based on the difference of the wafer weight before and after polishing using the polishing composition of each example under the polishing condition shown in Table 2.

The column of "removal rate of the (000-1)C face" of Table 1 shows results of evaluating the removal rate of polishing the (000-1)C face of a hexagonal silicon carbide single crystal wafer based on the difference of the wafer weight before and after polishing using the polishing composition of each example under the polishing condition shown in Table 2.

The column of "removal rate ratio((0001)Si face/(000-1)C face)" of Table 1 shows results of calculating the ratio of the removal rate of polishing the (0001)Si face of a hexagonal silicon carbide single crystal wafer to the removal rate of polishing the (000-1)C face of a hexagonal silicon carbide single crystal wafer using the polishing composition of each example.

The column of "stability of oxygen donor" of Table 1 shows results of evaluating the stability of an oxygen donor in the polishing composition of each example. Concretely, evaluation results are represented as "P" (poor) in the case oxygen bubble generation by the decomposition of oxygen donor was observed, as "F" (fair) in the case the slight oxygen bubble generation was observed, and as "G" (good) in the case the oxygen bubble generation was not observed in the slurry tank or the slurry supplying tube when polishing is performed using the polishing composition of each example.

TABLE 1

| | Vanadate or its alternative | | Oxygen donor | | Abrasive grains | | pH adjusting agent | pH | Removal rate of the (0001)Si face [nm/h] | Removal rate of the (000-1)C face [nm/h] | Removal rate ratio ((0001)Si face/(000-1)C face) | Stability of oxygen donor |
|---|---|---|---|---|---|---|---|---|---|---|---|---|
| | Type | Content [g/L] | Type | Content [g/L] | Type | Content [mass %] | | | | | | |
| Ex. 1 | $NH_4VO_3$ | 5 | $H_2O_2$ | 10 | colloidal silica | 10 | $H_2SO_4$ | 2.3 | 20.0 | 1171 | 0.02 | G |
| Ex. 2 | $NH_4VO_3$ | 5 | $H_2O_2$ | 10 | colloidal silica | 10 | $H_2SO_4$ | 4.2 | 30.1 | 616 | 0.05 | G |
| Ex. 3 | $NH_4VO_3$ | 5 | $H_2O_2$ | 10 | colloidal silica | 10 | $H_2SO_4$ | 5.3 | 49.9 | 239 | 0.21 | G |
| Ex. 4 | $NH_4VO_3$ | 5 | $H_2O_2$ | 10 | colloidal silica | 10 | — | 6.5 | 65.1 | 164 | 0.40 | G |

TABLE 1-continued

| | Vanadate or its alternative | | Oxygen donor | | Abrasive grains | | pH adjusting agent | pH | Removal rate of the (0001)Si face [nm/h] | Removal rate of the (000-1)C face [nm/h] | Removal rate ratio ((0001)Si face/(000-1)C face) | Stability of oxygen donor |
|---|---|---|---|---|---|---|---|---|---|---|---|---|
| | Type | Content [g/L] | Type | Content [g/L] | Type | Content [mass %] | | | | | | |
| Ex. 5 | $NH_4VO_3$ | 5 | $H_2O_2$ | 10 | colloidal silica | 10 | $NH_3$ | 7.6 | 83.8 | 137 | 0.61 | G |
| Ex. 6 | $NH_4VO_3$ | 5 | $H_2O_2$ | 10 | colloidal silica | 10 | $NH_3$ | 9.2 | 62.5 | 104 | 0.60 | G |
| Ex. 7 | $NH_4VO_3$ | 5 | $H_2O_2$ | 10 | colloidal silica | 10 | $NH_3$ | 10.0 | 37.7 | 102 | 0.37 | F |
| Ex. 8 | $NH_4VO_3$ | 5 | $H_2O_2$ | 3.3 | colloidal silica | 10 | — | 6.9 | 68.9 | 154 | 0.45 | G |
| Ex. 9 | $NH_4VO_3$ | 5 | $H_2O_2$ | 20 | colloidal silica | 10 | — | 6.1 | 62.1 | 181 | 0.34 | G |
| Ex. 10 | $NH_4VO_3$ | 5 | $H_2O_2$ | 33.3 | colloidal silica | 10 | — | 6.3 | 54.8 | 165 | 0.33 | G |
| Ex. 11 | $NH_4VO_3$ | 5 | $H_2O_2$ | 10 | colloidal silica | 5 | — | 6.1 | 32.4 | 176 | 0.18 | G |
| Ex. 12 | $NH_4VO_3$ | 5 | $H_2O_2$ | 10 | colloidal silica | 20 | — | 6.9 | 93.7 | 150 | 0.62 | G |
| Ex. 13 | $NaVO_3$ | 5 | $H_2O_2$ | 10 | colloidal silica | 30 | $H_2SO_4$ | 6.5 | 89.9 | 163 | 0.55 | G |
| Ex. 14 | $NaVO_3$ | 5 | $H_2O_2$ | 10 | colloidal silica | 10 | $H_2SO_4$ | 6.4 | 78.8 | 166 | 0.47 | G |
| Ex. 15 | $NaVO_3$ | 10 | $H_2O_2$ | 10 | colloidal silica | 10 | $H_2SO_4$ | 6.2 | 78.8 | 285 | 0.28 | G |
| Ex. 16 | $NaVO_3$ | 15 | $H_2O_2$ | 10 | colloidal silica | 10 | $H_2SO_4$ | 5.9 | 91.8 | 360 | 0.26 | G |
| C. Ex. 1 | — | — | — | — | colloidal silica | 10 | $H_2SO_4$ | 2.2 | 8.0 | 75 | 0.11 | not yet evaluated |
| C. Ex. 2 | — | — | — | — | colloidal silica | 10 | $H_2SO_4$ | 5.3 | 6.5 | 59 | 0.11 | not yet evaluated |
| C Ex. 3 | — | — | — | — | colloidal silica | 10 | $H_2SO_4$ | 7.5 | 4.6 | 73 | 0.06 | not yet evaluated |
| C. Ex. 4 | — | — | — | — | colloidal silica | 10 | — | 10.1 | 3.4 | 71 | 0.05 | not yet evaluated |
| C. Ex. 5 | $NH_4VO_3$ | 5 | — | — | colloidal silica | 10 | — | 8.5 | 16.0 | 68 | 0.24 | not yet evaluated |
| C. Ex. 6 | — | — | $H_2O_2$ | 10 | colloidal silica | 10 | — | 9.9 | 10.3 | 75 | 0.14 | F |
| C. Ex. 7 | $Fe(NO_3)_3$ | 5 | $H_2O_2$ | 10 | colloidal silica | 10 | — | 2.4 | 3.8 | 59 | 0.06 | P |
| C. Ex. 8 | $Na_2MoO_4$ | 5 | $H_2O_2$ | 10 | colloidal silica | 10 | — | 9.8 | 7.6 | 80 | 0.10 | P |
| C. Ex. 9 | $Na_2WO_4$ | 5 | $H_2O_2$ | 10 | colloidal silica | 10 | — | 10.1 | 14.1 | 58 | 0.24 | P |

$NH_4VO_3$ denotes ammonium vanadate,
$NaVO_3$ denotes sodium vanadate,
$Fe(NO_3)_3$ denotes iron nitrate,
$Na_2MoO_4$ denotes disodium molybdate,
$Na_2WO_4$ denotes disodium tungstate,
$H_2O_2$ denotes hydrogen peroxide,
$H_2SO_4$ denotes sulfuric acid, and
$NH_3$ denotes ammonia

TABLE 2

| | |
|---|---|
| Polishing machine: | "EJ-380IN" made by Engis Japan Corporation |
| Polishing pad: | polishing pad "Suba 800" of non-woven fabric made by Nitta Haas Inc. |
| Object of polishing: | n type 6H-SiC single crystal wafer with a diameter of 2 inches (50 mm) |
| Feeding speed of the polishing composition: | 50 mL/min. |
| Polishing pressure: | 500 g/cm² |
| Rotation speed of machine platen: | 80 rpm |
| Rotation speed of head: | 30 rpm |
| Polishing time: | 4 hours |

As shown in Table 1, in Examples 1 to 16, regarding the (0001)Si face, the removal rate obtained was not less than 20 nm/h, a value of practical level, and regarding the (000-1)C facet the removal rate obtained was not less than 100 nm/h, a value of practical level. Moreover, evaluation results regarding the stability of oxygen donors were fair or good.

In contrast, in Comparative Examples 1 to 9, regarding the (0001)Si face, the removal rate obtained was less than 20 nm/h, and regarding the (0001)C face, the polishing rate obtained was less than 100 nm/h; the values in either case did not attain a level sufficient for practical use. Moreover, in Comparative Examples 7 to 9 wherein a nitrate, a molybdate, or a tungstate was used instead of a vanadate, any evaluation result regarding the stability of the oxygen donor was poor.

In addition, on wafer surfaces after polished using the polishing compositions of the Examples 1 to 16, atomic steps were observed on both the (0001)Si face and the (000-1)C face by an atomic force microscope.

The invention claimed is:

1. A polishing composition in combination with a silicon carbide wafer, the polishing composition comprising a vanadate and an oxygen donor, wherein the vanadate is ammonium vanadate, sodium vanadate, or potassium vanadate.

2. The polishing composition combination according to claim 1, further comprising abrasive grains.

3. The polishing composition combination according to claim 1, wherein the polishing composition has a pH of 4 to 11.5 and is used for polishing the (0001)Si face of a hexagonal silicon carbide single crystal wafer.

4. The polishing composition combination according to claim 1, wherein the polishing composition has a pH not more than 8 and is used for polishing the surface of a hexagonal silicon carbide single crystal wafer other than the (0001)Si face.

5. The polishing composition combination according to claim 1, wherein the polishing composition has a pH of 4 to 8, and is used for polishing at least either one of the (0001)Si face of a hexagonal silicon carbide single crystal wafer and the surface of the hexagonal silicon carbide single crystal wafer other than the (0001)Si face.

6. A polishing composition in combination with a silicon carbide wafer comprising a (0001)Si face and an (000-1)C face, the polishing composition comprising a vanadate and an oxygen donor, wherein the vanadate is selected from the group consisting of ammonium vanadate, sodium vanadate, and potassium vanadate, the polishing composition provides a removal rate for each of said respective faces when the silicon carbide wafer is polished, and wherein the removal rate obtained for the (0001)Si face is not less than 20 nm/h and the removal rate for the (000-1)C face is not less than 100 nm/h.

* * * * *